US010036784B2

(12) United States Patent
Shams et al.

(10) Patent No.: US 10,036,784 B2
(45) Date of Patent: Jul. 31, 2018

(54) VARIABLE PERMEABILITY MAGNETOMETER SYSTEMS AND METHODS FOR AEROSPACE APPLICATIONS

(71) Applicant: The United States of America as represented by the Administrator of the National Aeronautics and Space Administration, Washington, DC (US)

(72) Inventors: Qamar A. Shams, Yorktown, VA (US); John F. Sutton, Springs, WV (US)

(73) Assignee: THE UNITED STATES OF AMERICA AS REPRESENTED BY THE ADMINISTRATOR OF NASA, Washington, DC (US)

( * ) Notice: Subject to any disclaimer, the term of this patent is extended or adjusted under 35 U.S.C. 154(b) by 293 days.

(21) Appl. No.: 14/676,172

(22) Filed: Apr. 1, 2015

(65) Prior Publication Data

US 2016/0139213 A1    May 19, 2016

Related U.S. Application Data

(60) Provisional application No. 62/080,455, filed on Nov. 17, 2014.

(51) Int. Cl.
*G01R 33/028* (2006.01)
*G01V 3/10* (2006.01)
(Continued)

(52) U.S. Cl.
CPC ......... *G01R 33/028* (2013.01); *G01R 33/022* (2013.01); *G01V 3/081* (2013.01); *G01V 3/10* (2013.01)

(58) Field of Classification Search
CPC .... G01R 33/028; G01R 33/022; G01R 3/081; G01V 3/10
(Continued)

(56) References Cited

U.S. PATENT DOCUMENTS 4,677,379 A * 6/1987 Arnaud .............. G01N 27/9046
324/240
4,720,681 A * 1/1988 Sinclair .................... G01V 3/38
324/233

(Continued)

OTHER PUBLICATIONS

Ellie Zolfagharifard, "Forget Global Warming, Worry About the MAGNETOSPHERE: Earth's Magnetic Field is Collapsing and it could Affect the Climate and Wipe Out Power Grids", Jan. 2014, Accessed Mar. 13, 2015 at http://www.dailymail.co.uk/sciencetech/article-2545465.

(Continued)

*Primary Examiner* — Patrick Assouad
*Assistant Examiner* — Khristopher Yodichkas
(74) *Attorney, Agent, or Firm* — Andrea Z. Warmbier; Robin W. Edwards; Mark P. Dvorscak (57) ABSTRACT

A magnetometer configured to measure low field strength magnetic fields is provided. Certain embodiments of the magnetometer include a cylindrical coil assembly having a variable permeability core and terminals disposed at both ends. A current source circuit may be operably connected to the terminals and configured to apply a voltage controlled current across the terminals. A voltage readout circuit may be operably connected to the terminals and configured to measure a voltage across the terminals due to the applied current from the current source. An inductance of the coil assembly directly varies as an ambient magnetic field strength varies a permeability of the variable permeability core, and a voltage across the terminals varies directly with
(Continued)

the inductance such that the measured voltage across the terminals is a direct measure of the ambient magnetic field strength.

17 Claims, 7 Drawing Sheets

(51) Int. Cl.
*G01R 33/022* (2006.01)
*G01V 3/08* (2006.01)

(58) Field of Classification Search
USPC .......................................................... 324/253
See application file for complete search history.

(56) References Cited

U.S. PATENT DOCUMENTS

| | | | |
|---|---|---|---|
| 4,851,775 A | 7/1989 | Kim et al. | |
| 4,894,615 A * | 1/1990 | Mermelstein | G01R 33/02 310/326 |
| 6,597,178 B1 * | 7/2003 | Nichols | G01V 3/28 324/339 |
| 7,086,593 B2 | 8/2006 | Woodard et al. | |
| 8,487,605 B1 * | 7/2013 | Dea | G01W 1/16 324/244 |
| 2003/0052777 A1 * | 3/2003 | Bleier | G01V 1/008 340/540 |
| 2005/0146326 A1 * | 7/2005 | Li | G01R 33/04 324/250 |
| 2007/0164736 A1 * | 7/2007 | Joisten | G01R 33/05 324/253 |
| 2007/0233390 A1 | 10/2007 | Freund | |
| 2008/0030339 A1 * | 2/2008 | Gadonniex | G08B 13/2408 340/572.6 |
| 2014/0320133 A1 * | 10/2014 | Olsson | G01V 3/10 324/329 |
| 2016/0341536 A1 * | 11/2016 | Reime | G01B 7/023 |

OTHER PUBLICATIONS

Stephen Luntz, "Earth's Electromagnetic Field Is Weakening", Jun. 21, 2014, Accessed Mar. 13, 2015 at http://www.iflscience.com/physics/earths-electromagnetic-field-weakening.
Karen C. Fox, "Lightning-made Waves in Earth's Atmosphere Leak Into Space", Nov. 28, 2011, Accessed Mar. 13, 2015 at http://www.nasa.gov/mission_pages/sunearth/news/lightning-waves.html.
Joseph L. Kirschvink, "Earthquake Prediction by Animals: Evolution and Sensory Perception," Bulletin of the Seismological Society of America, Apr. 2000, pp. 312-323, vol. 90, No. 2.
John F. Sutton et al., "A Broadband Active Antenna for ELF Magnetic Fields," Physics Essays, 1993, pp. 52-59, vol. 6, No. 1.
Juho Luomahaara at al., "Kinetic Inductance Magnetometer," Nature Communications, 2014, pp. 1-7.
Ambrose Fleming, "On Atoms of Action, Electricity, and Light," Philosophical Magazine and Journal of Science, Jul.-Dec. 1932, pp. 591-599, vol. 14—Seventh Series, Taylor and Francis Publishers, London.
Craig F. Bohren, "How Can a Particle Absorb More than the Light Incident on It?" Am. J. Phys., Apr. 1983, pp. 323-327, vol. 51, No. 4.
H. Paul et al., "Light Absorption by a Dipole," Sov. Phys. Usp., Oct. 1983, pp. 923-926. vol. 26, No. 10.
Metglas Company Inc., Technical Bulletin, 2714A, Accessed Mar. 13, 2015, http:///www.metglas.com/assets/pdf/2714a.pdf.
Electro-Metrics website, http://www.electro-metrics.com/product/em-7530/249/, last accessed on Feb. 28, 2017.
Electro-Metrics website EM-7530 brochure, http://www.electro-metrics.com/docs/datasheets/6/Fixed%20Stuff%20100524/7530_New_Version.pdf, las accessed on Feb. 28, 2017.
EMCO brochure, Magnetic Field Interisity Meter Model 6640.
Rudenberg, R., "Der Empfang Elektrischer Wellen in der Drahilosen Telegraphic," Annalen der Physik, 1908, Band 25, p. 446, Leipzig, GE. Including English Translation.
G.C. Spaniol and J.F. Sutton, Physics Essays 6, pp. 52-59, Mar. 1993.

* cited by examiner

VARIABLE PERMEABILITY MAGNETOMETER SYSTEMS AND METHODS FOR AEROSPACE APPLICATIONS

CROSS-REFERENCE TO RELATED PATENT APPLICATION

This patent application claims the benefit of and priority to U.S. Provisional Patent Application No. 62/080,455, filed on Nov. 17, 2014, the contents of which are hereby incorporated by reference in their entirety.

STATEMENT REGARDING FEDERALLY SPONSORED RESEARCH OR DEVELOPMENT

The invention described herein was made in part by an employee of the United States Government and may be manufactured and used by or for the Government of the United States of America for governmental purposes without the payment of any royalties thereon or therefore.

TECHNICAL FIELD

Aspects of this disclosure generally relate to systems and methods for sensing a magnetic field strength and in particular relate to variable permeability magnetic sensors for measuring low strength and low frequency magnetic fields for aerospace applications.

BACKGROUND OF THE INVENTION

Deep within the earth, flow of molten iron generates electric currents which in turn produce magnetic field which protects the earth from devastating solar winds. According to some estimates, the Earth's magnetic field has weakened by 15 percent over the last 200 years with additional evidence emerging that the weakening is happening unevenly with some areas across the planet getting more protection. According to data collected by a European Space Agency (ESA) satellite array called Swarm, the biggest weak spots in magnetic field have sprung up over the Western Hemisphere and strengthened over areas like the southern Indian Ocean. It has been suggested that powerful electric currents are generated deep inside the Earth causing low frequency electromagnetic signals that have long been reported in connection with impending earthquake activity. The current from the stressed rocks is carried out to and through unstressed surrounding rocks by positive holes similar to related ones in semiconductor materials. These underground positive holes leave behind a surplus of electrons. This process gives rise to positive air ions which changes local and even regional magnetic fields and could be an indication of an impending earthquake in the area. Such low-frequency electromagnetic emissions (EM) have been documented by a large body of satellite data and/or ground-based data.

Generally, critical scientific data to study electromagnetic field strengths indicative of geophysical weather and atmospheric changes lies in a frequency response range from DC to 100 Hz. Accordingly, there is a need for a network of ground-based magnetometers to track and record minute changes in various measurements, e.g., Schumann resonance variation, Earth's static magnetic field variation, and/or the planetary static and dynamic magnetic fields with sensitivity from the nano-tesla to pico-tesla range.

In 1952, Schumann published a paper about standing electromagnetic waves in the waveguide between the Earth's surface and the ionosphere. These waves are known as Schumann resonance (SR) waves and can be used for various scientific studies ranging from global lightning to detection of space weather and global climate variations. The Schumann resonances are a set of resonant modes or spectrum peaks, between 7.83 and 45 Hz. These waves are very weak compared to the Earth's much larger static geomagnetic field, which is on the order of 50,000 microgauss. Solar or geomagnetic activity can be tracked by measurement of changes of the dielectric permeability in the Schumann cavity. For example, lightning is one such natural phenomenon and can be tracked around the clock by measurement of Schumann resonance values. The Schumann resonances offer means for investigating tropospheric-ionospheric coupling mechanisms related to lightning activity and wave propagation in the ionosphere. At any given moment, there are between 50 and 100 lightning flashes around the globe. These lightning flashes create low frequency electromagnetic waves which are trapped between the ionosphere and the Earth.

Extremely low frequency (ELF) electromagnetic waves have long wavelengths. For example, 10 Hz corresponds to a wavelength of 30,000 kilometers. In atmospheric and magnetosphere science, the lower frequency electromagnetic oscillations are considered to lie in the extra low frequency ("ELF") range. It is extremely difficult to build an antenna to capture these ELF signals. The ELF frequencies have been used in only a very few man-made communication systems. Due to long electric power lines, there are unintentional sources of ELF radiation, in the 50 or 60 Hz range. Due to their long wavelength, these ELF waves can penetrate seawater and significant distances down into earth or rocks, and through the earth. Similarly if ELF electromagnetic waves are generated deep inside the earth, these signals are capable of appearing on the surface and can be detected using low frequency electromagnetic antennas or magnetometers. One of the requirements of these ELF antennas or magnetometers is that they should produce extremely low background noise and enough sensitivity to detect weak signals. Electronic 1/f noise is another factor which has to be considered when designing ELF antennas or low frequency magnetometers.

One of the other sensing systems to detect magnetic fields is a standard LC oscillator circuit where L is made of a coil, wound on a typical magnetic material. The magnetic material coil L becomes part of the oscillator LC circuit to sense the surrounding magnetic field. Because a resonant frequency varies as the square root of magnetic field strength in a standard LC oscillator circuit, a measured shift in frequency of an LC oscillator circuit provides an indication of a relative magnetic field strength, with decreasing precision at lower frequency responses. Thus, LC oscillator circuits are sufficient designs for Gaussmeters, i.e., for measuring larger scale magnetic fields. In some other magnetic field measurement circuits, relaxation oscillators are employed which produce a non-sinusoidal repetitive output signal. These circuits have a resonant frequency that varies directly with magnetic field strength, thus making them a more preferred design choice for measuring low frequency signals. However, relaxation oscillators have stability issues. In relaxation oscillator circuits, the electronic device operates in an extremely nonlinear fashion and any variation in oscillation amplitude may also appear as a frequency change. They have low duty cycle and poor phase-noise as well.

Accordingly, there are difficulties in designing sensor systems capable of measuring magnetic fields of low level strength and for extreme low frequency measurements that overcome the aforementioned drawbacks. For example, flux gates sensors, which employ coils of wire around a core of highly permeable magnetic material to directly sense a magnetic field, are difficult to build and require low noise readout circuitry. Super Conducting Quantum Interference Devices (SQUIDS) can measure subtle magnetic field strengths using superconducting loops containing Josephson junctions, but require cryogenic cooling and are therefore unsuitable for most field applications.

Search coil magnetometers use coils around a high permeability core to measure variation in magnetic flux, but generally have poor sensitivity at low frequencies. Certain search coil magnetometers have been developed for measuring low magnetic field strength signals which employ ferromagnetic or μ-metal materials but require large number of turns, are bulky, and suffer from eddy and damping losses. Because ferromagnetic and μ-metal based sensors have relatively constant permeabilities, a time rate change of field (dH/dt) is used to measure ambient magnetic field. However, a time rate change of field at low frequencies is small, thus making signal detection at such low frequencies very difficult. Further, the calibration of p-metal or ferromagnetic material magnetometers is difficult.

For example, a search coil magnetometer made of p-material has been installed in the Antarctic region of the Southern hemisphere to study waves and transient variations in Earth's magnetic field in the Ultra-Low-Frequency range, from approximately 0.001 Hz to 5 Hz. This magnetometer has 160,000 turn coils of copper wire mounted on 2.625-foot long rod which weighs more than 15 pounds. This magnetometer is not suitable for frequency response above 5 Hz and is therefore not an appropriate sensor for measuring Schumann resonance frequency ranges. Further, due to its conductive nature, this material can cause damping losses. Similarly another search coil magnetometer, installed on the NASA THEMIS mission, has 51,600 turns and requires another secondary winding to introduce a flux feedback in order to flatten the frequency response. This magnetometer suffers from low sensitivity at higher frequency as well.

As described above, most known magnetometers used for aerospace applications were developed using magnetic materials having relatively constant permeabilities. A variable permeability magnetometer takes advantage of a variance of permeability of a magnetic material with a changing in ambient magnetic field. Known sensors using the variation of the permeability of a magnetic core are able to measure large magnetic fields on the order of one Gauss, e.g., Gaussmeters. For example, U.S. Pat. No. 4,851,775 is directed to a magnetometer which includes a sensor coil around a strip of Metglas Amorphous Alloy 2705 M in a relaxation oscillator circuit. However, as previously described, relaxation oscillator circuits suffer from stability problems, so they are not suitable for precision measurements of low strength magnetic fields.

Prior solutions for measuring magnetic field strengths have not resolved the need for an approach to measuring frequency response in a Schumann resonance range while still employing a relatively simple and compact construction. Therefore, there is a need for systems and methods that address one or more of the deficiencies described above.

BRIEF SUMMARY OF THE INVENTION

The following presents a general summary of aspects of this invention in order to provide a basic understanding of at least some aspects of the invention. This summary is not an extensive overview of the invention. It is not intended to identify key or critical elements of the invention or to delineate the scope of the invention. The following summary merely presents some concepts of the invention in a general form as a prelude to the more detailed description provided below.

Aspects of this disclosure relate to a magnetometer for measuring magnetic field strengths in a frequency response range between approximately 0 and 700 Hz. In certain embodiments, the magnetometer includes a cylindrical coil assembly having a variable permeability core and terminals disposed at both ends of the cylindrical coil assembly. A current source circuit may be operably connected to the terminals and configured to apply a voltage controlled current to the terminals. A voltage readout circuit may be operably connected to the terminals and configured to measure a voltage across the terminals due to the applied current from the current source. An inductance of the coil assembly directly varies as an ambient magnetic field strength varies a permeability of the variable permeability core, and a voltage across the terminals varies directly with the inductance such that the measured voltage across the terminals is a direct measure of the ambient magnetic field strength.

In certain embodiments, a coil assembly of a magnetometer, including for example, the magnetometer described above or any magnetometer described herein, may include a variable permeability core forming a right circular cylindrical shape and a search coil including a sense winding wound over the variable permeability core. The sense winding may be comprised of enameled copper wire having 500 turns or higher. A high number of turns may provide higher sensitivity. In one embodiment, the wire may have approximately 600 turns.

A variable permeability magnetometer takes advantage of the varying of the permeability of a magnetic material with a change in ambient magnetic field. For example, a Metglas magnetic material has a permeability which varies widely with ambient magnetic field. A measurement of the permeability of the Metglas based magnetometer is, in effect, a measurement of the ambient magnetic field strength. Accordingly, the variable permeability core of the magnetometer may include a foil strip comprised of Metglas magnetic material. A coil form may be included with the variable permeability core for housing the foil strip.

In certain embodiments, the coil assembly may further include a secondary or feedback winding disposed over the sense winding. The feedback winding may be configured to substantially provide feedback to enhance a reception cross section of the search coil. The secondary winding may be used for calibration of the magnetometer as well. However, the feedback winding is not necessary for operation of the variable permeability magnetometer. The voltage readout circuit may include double synchronous demodulator and/or a low pass filter. The current source circuit may include a crystal oscillator configured to provide a clock signal to drive the current source circuit to apply the voltage controlled current across the terminals, a digital frequency divider configured to divide the clock signal of the crystal oscillator to a lower frequency, and/or a signal shaper configured to shape the lower frequency signal of the digital frequency divider into a sinusoidal form. In some aspects, the current source circuit is configured to adjust the applied current across the terminals to bias the variable permeability core to an optimum location of a core permeability curve.

It is not uncommon to deploy magnetometers for long durations in inaccessible regions, thus limiting access to perform routine calibration. A secondary winding will accomplish exactly that. A microprocessor based miniaturized electronics board can pass a fixed amount of current at desired time and record responses of the magnetometer. This capability could also benefit the geophysical, global monitoring and other disciplines by providing this useful calibration capability at lower cost.

Further aspects relate to methods for measuring magnetic field strengths including applying a sinusoidal, voltage-controlled current across terminals of a coil assembly having a variable permeability core and measuring a voltage applied across the terminals due to the applied sinusoidal, voltage-controlled current. A low-frequency magnetic field strength may be calculated from the measured voltage, wherein the magnetic field strength is indicative of a presence of a geophysical or atmospheric event, e.g., an earthquake, hurricane, thunderstorm, tornado, or the like. Measuring the voltage may include applying a low pass filter and/or applying a double synchronous detector for detecting a measured voltage with noise and direct current offsets substantially eliminated. Applying the sinusoidal, voltage-controlled current may include providing a clock signal, by a crystal oscillator, to drive a high-output impedance current source, and/or dividing the clock signal of the crystal oscillator to a lower frequency signal and shaping the lower frequency signal into a sinusoidal form.

In certain embodiments, the method may further include applying a feedback signal to a feedback winding of the coil assembly, thereby enhancing the receiving cross section of the magnetometer, and measuring an adjusted voltage across the terminals. Measuring the adjusted voltage may further include removing, by the feedback signal, variations in the ambient magnetic field strength due to a change in the coil assembly orientation.

In another embodiment, the secondary winding of the coil assembly may be used for calibration of the magnetometer. A known current is passed through the secondary coil hence producing a known magnetic field around the coil which is used for calibration purposes.

These and other features, advantages, and objects of the present invention will be further understood and appreciated by those skilled in the art by reference to the following specification, claims, and appended drawings.

DETAILED DESCRIPTION OF THE INVENTION

In the following description of various examples of the invention, reference is made to the accompanying drawings which show, by way of illustration, various example systems and environments in which aspects of the present disclosure may be practiced. It is to be understood that other specific arrangements of parts, example systems, and environments may be utilized and structural and functional modifications may be made without departing from the scope of this disclosure.

In addition, the present disclosure is described in connection with one or more embodiments. The descriptions set forth below, however, are not intended to be limited only to the embodiments described. To the contrary, it will be appreciated that there are numerous equivalents and variations that may be selectively employed that are consistent with and encompassed by the disclosures below.

Figure 1:
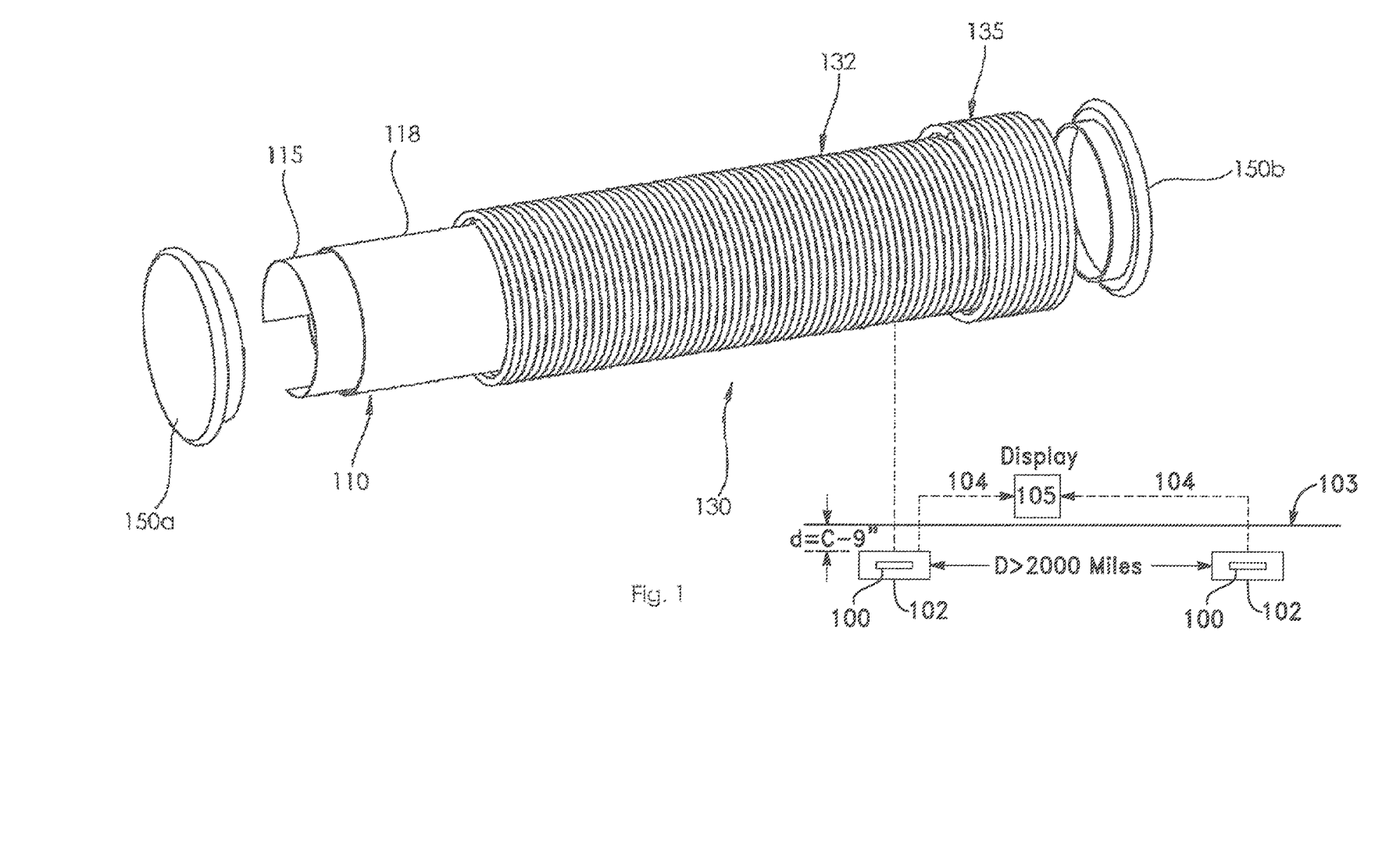
FIG. 1 is an exploded view of a magnetometer coil assembly in accordance with an embodiment.

The present disclosure relates to a magnetic sensor, also referred to as a magnetometer, employing a coil assembly having a variable permeability core. The magnetometer is configured for measuring of low level strength magnetic fields in the surroundings from natural or man-made events, e.g., in a frequency response range between 0 and 100 Hz. Referring to FIG. 1, an example implementation of a coil assembly 100 used as a magnetic field sensor is shown. Coil assembly 100 includes a right circular cylindrical search coil 130 wound over a variable permeability magnetic core 110 and coil terminals 150a and 150b disposed at both ends.

Figure 4:
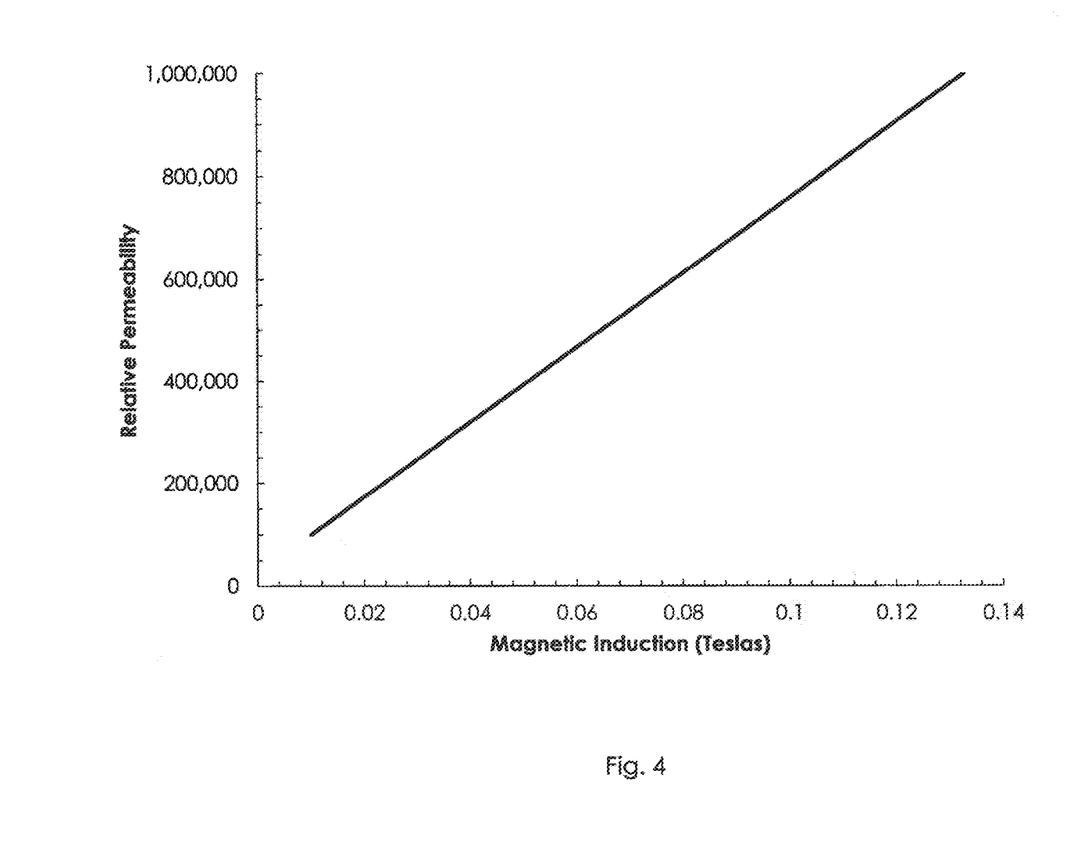
FIG. 4 is a schematic graphical representation of the relative permeability variation with magnetic field variation a variable permeability core of a magnetometer in accordance with an embodiment.

The variable permeability magnetic core 110 has a permeability that varies widely with an ambient magnetic field in order to extend the magnetometer's low frequency response sensitivity. Such a permeability response 400 is shown in the graphical representation of FIG. 4 which shows a change in relative permeability with changing magnetic inductance. As shown in FIG. 1, the core 110 includes a foil strip 115 housed in a coil form 118. For example, coil form 118 may be a plastic cylindrical form, on the order of approximately 6 inches long and ⅜ inches in diameter and foil strip 115 may be approximately 2 inches wide and rolled up when placed inside coil form 118. Alternatively, the foil strip 115 may be wrapped around the coil form 118. The foil strip is comprised of a variable permeability magnetic material, such as Metglas #2714A cobalt-alloy magnetic material or any other high permeability magnetic material which varies in relative permeability from approximately 10 to 1 million.

A measurement of the permeability of the variable permeability core is, in effect, a measurement of the ambient magnetic field strength. The variable permeability magnetic core results in the inductance of the coil assembly varying with an ambient magnetic field, such that a measurement of the inductance of the coil assembly provides a measure of the magnetic field strength. Thus, rather than following an LC oscillator varying-frequency-with-varying-inductance approach, inductance can be measured directly to provide a magnetic field strength. Further, when a voltage controlled current source is applied across the terminals, a voltage across the terminals varies directly with the inductance, such that a measured voltage across the terminals is a direct measure of the ambient magnetic field strength.

The search coil 130 employs a sense winding 132 to sense a magnetic field strength. For example, the sense winding may be comprised of AWG #30 enameled copper wire winding and may include 500 turns or higher, in one embodiment 600 turns, which is significantly less than number of turns, employed in known sensors for measuring low strength magnetic fields. The sense winding 132 with the variable permeability magnetic core 110 extends the sensitivity of sensed magnetic fields strengths into the nano-Tesla range. With this much sensitivity, a variation in orientation of the coil assembly in the Earth's field (approximately 0.5 Gauss or 50,000 nano-Teslas) can cause an output signal to go into saturation. To prevent this from happening, a secondary winding or feedback winding 135 is wound over the sense winding 132 so that a feedback signal can be applied to cancel out variation in the Earth's field caused by a change in orientation. Alternatively, the feedback can be applied directly to the sense winding. The feedback or calibration winding may include somewhere one third to half of the number of turns of sense winding. The feedback winding improves performance by enhancing the effective receiving cross section of the magnetometer. The resulting performance improvement from the feedback winding, in turn, causes the search coil to have a more uniform frequency response over several decades of frequency and improved sensitivity through interaction of the search coil magnetic field with the ambient magnetic field.

Figure 2:
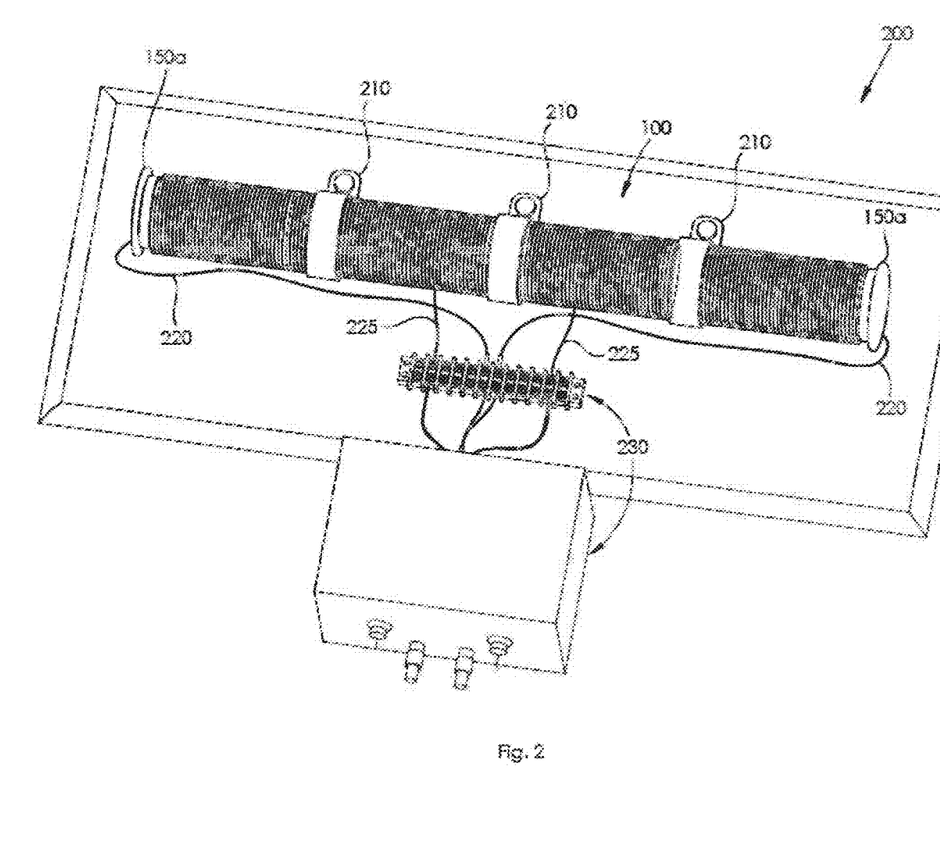
FIG. 2 is a schematic view of a magnetometer in accordance with an embodiment.

According to an embodiment illustrated in FIG. 2, a magnetometer includes a coil assembly 100 clamped with one or more clamps 210. Leads 220 at the terminals 150a, 150b connect the sense winding 132 to an electronics board 230 of the magnetometer. Leads 220 apply a current, from a current source, across the terminals 150a, 150b of the sense winding 132 and detect/measure a voltage across the terminals 150a, 150b. The secondary winding 135 can be used either for feedback or for calibration purposes. If used as feedback, leads 225 are connected to the feedback winding 135 for applying a feedback signal to the magnetometer 200. If used for calibration, a known current is passed through the coils and electromagnetic field generated in the sensing coil is measured for calibration.

Figure 3:
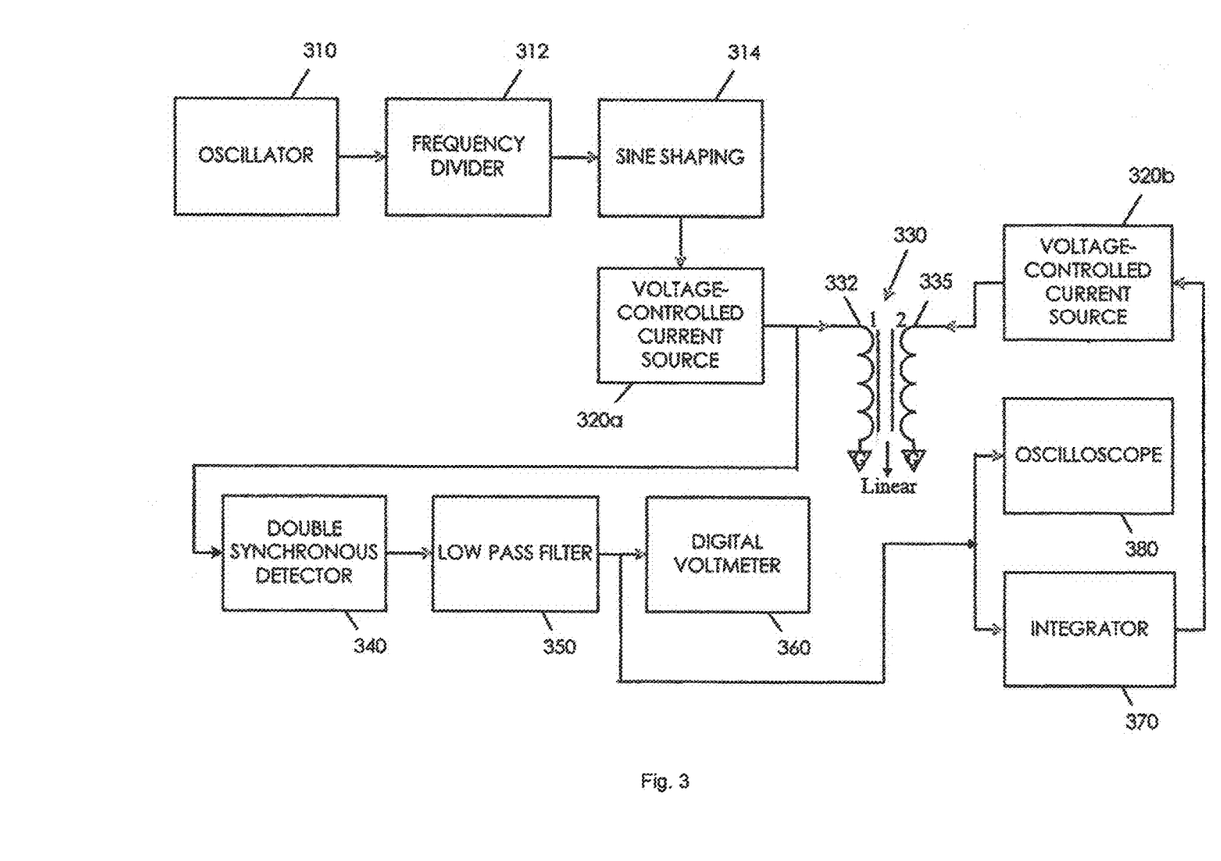
FIG. 3 is a block diagram of a magnetometer in accordance with an embodiment.

In FIG. 3, a block diagram of an example implementation for a magnetometer 300 with associated circuitry is shown for maintaining the stability and sensitivity of the magnetometer at low strength magnetic fields. Circuit stability is achieved through the use of a crystal oscillator 310 for frequency stability and matched resistor networks for amplitude stability in the voltage readout. For example, oscillator 310 may be a 1 MHz crystal controlled digital clock oscillator. Oscillator 310 is a stable crystal controlled oscillator and can be used to measure the inductance of the coil. The inductance of the coil depends only on the number of turns in the coil and on the permeability of the Metglas. Unlike relaxation oscillators, oscillator 310 has no resistance with its TEMPCO which has potential to cause variation of the output signal with temperature. A frequency divider 312 then divides down the 1 MHz signal to approximately 10 kHz. Sine shaping 314 then shapes the 10 kHz digital signal into a sinusoidal form. The sinusoidal 10 kHz digital signal drives a voltage-controlled current source 320a, e.g., a precision fixed-frequency high-output-impedance current source, which, in turn, drives sense winding 332 of coil assembly 330. In other words, current source 320a applies a current across the terminals of the sense winding 332. As an ambient magnetic field varies the permeability of the core the coil assembly 330, the inductance of the sense winding 332 varies. Thus the voltage across the coil assembly 330, which varies directly with the coil inductance, is a measure of the magnetic field strength.

Accordingly, an ambient magnetic field strength can be measured by applying a current, from current source 320a across terminals of the sense winding 332 and then measuring a voltage across the terminals of the sense winding 332. The current source 320a may also adjust the applied current across the terminals of the sense winding 332 to bias the variable permeability core to an optimum location of a core permeability curve. The current source 320a may incorporate low TEMPCO resisters (not shown) to provide thermal compensation and maintain sensitivity of the measured response.

A low noise voltage readout circuit, as shown in FIG. 3, includes a digital voltmeter 360, a double synchronous demodulator 340 and a low pass filter 350. Double synchronous demodulator 340 is employed for signal detection. The double synchronous detector eliminates the switch-generated noise usually produced by single synchronous detectors, thereby easing the requirements on the low pass filter 350 for providing a low noise voltage signal for the digital voltmeter 360 to display. To provide a feedback signal, an integrator 370 drives a second current source 320b to apply a current to feedback winding 335 and monitored by oscilloscope 380. This feedback signal can also be used as a measure of extremely low frequency magnetic field strength variations.

Figure 5:
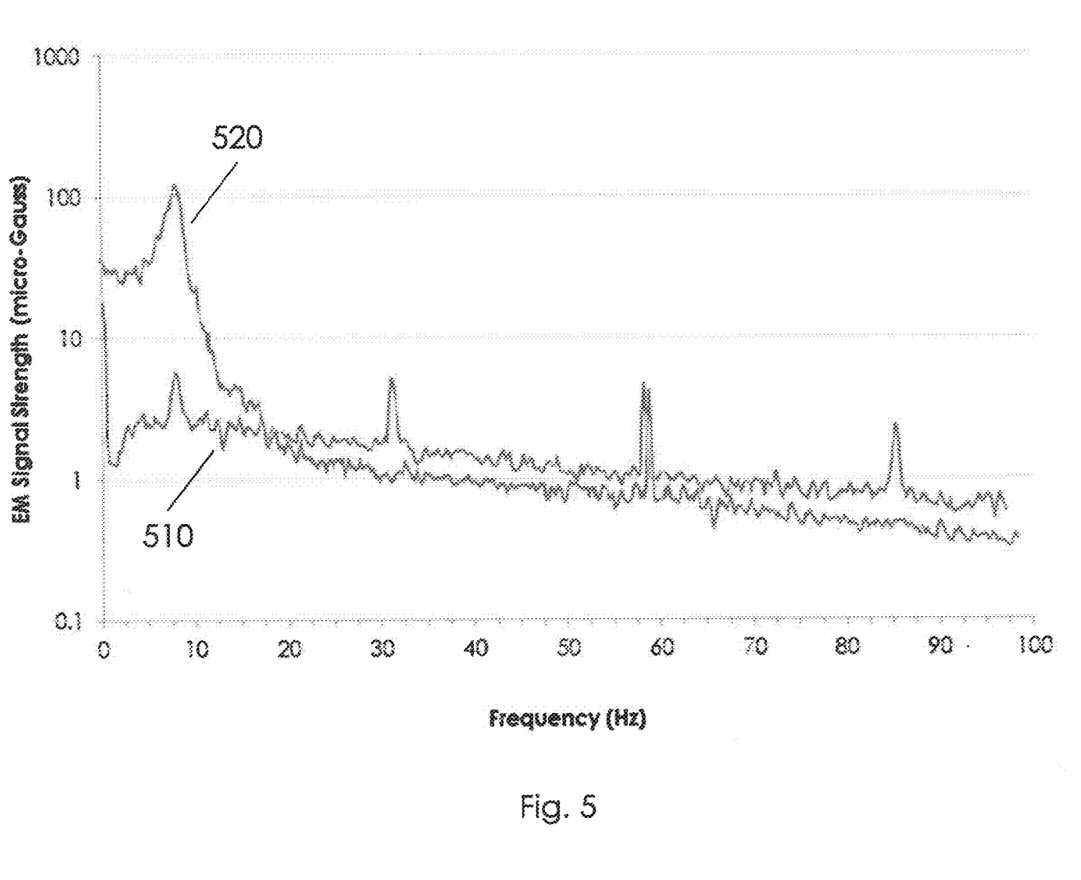
FIG. 5 is a schematic graphical representation of electromagnetic field strength in the frequency domain for various conditions.

A sensitivity of the magnetometer to an ambient magnetic field background noise may need to be initially determined prior to assessing variations on the magnetic field. In other words, the initial ambient magnetic field background noise provides a noise floor and the change from subsequent measurements to the noise floor represents a degree of the magnetic field response, potentially indicative of a pending natural event, e.g., a storm, solar flare, local lightning, or, to some reports, even a pending earthquake. For example, FIG. 5 shows electromagnetic background signals from 0 to 100 Hz of a normal electromagnetic signal 510 having what is believed to be fundamental Schumann resonance peak at around 8.25 Hz absent of any strong weather-related or geophysical event and a second signal 520 associated with a Schumann resonance peak during a strong typhoon in the pacific region. While both responses show a peak at the Schumann Resonance frequency of Earth at around 8.25 Hz, the strength of the typhoon signal 520 is much larger, particularly around the Schumann resonance frequency.

Figure 6A:
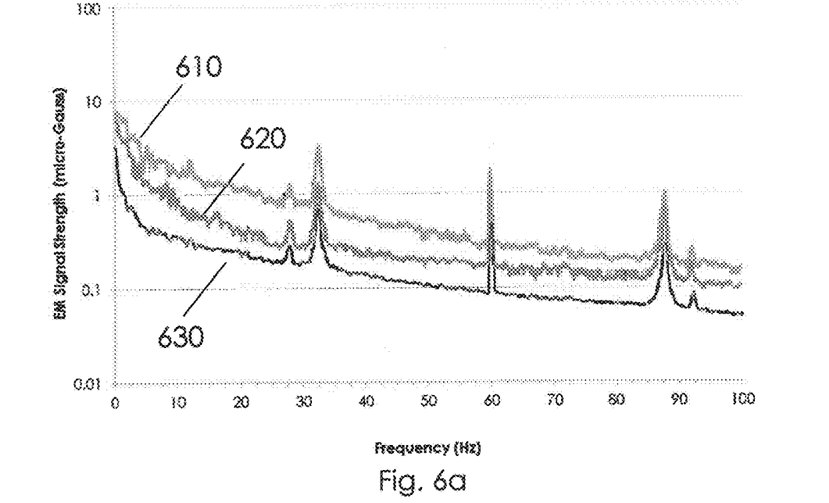
FIGS. 6a and 6b are schematic graphical representations of electromagnetic field strengths in the frequency domain for various time intervals and a time series of noted frequency modes over several time intervals, respectively.
Figure 6B:
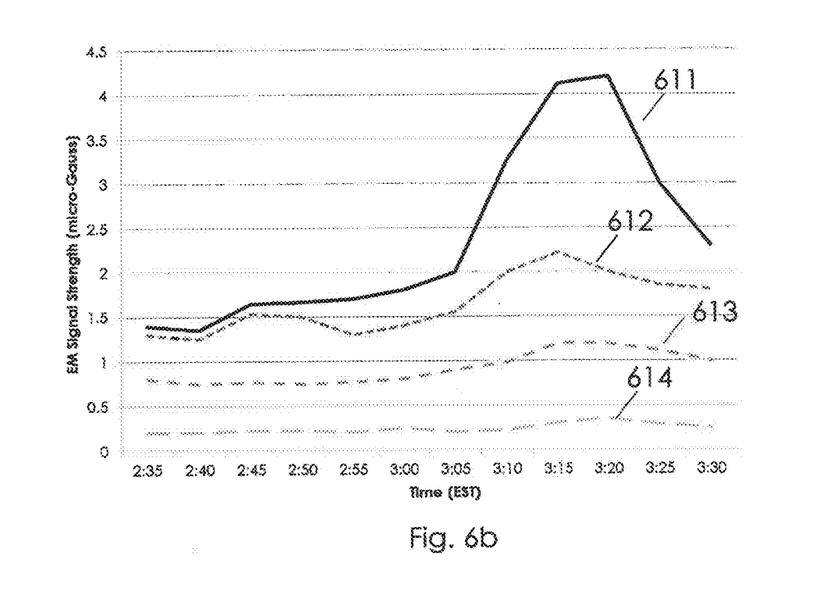

Once the frequency response range of a particular occurrence is known, peaks in a specified frequency range can be tracked over time. For instance, FIG. 6a shows several electromagnetic signals 610, 620, and 630 in the frequency domain representing various time intervals throughout a storm event, e.g., a hurricane. Peaks are noted at 32.25 Hz, 60.00 Hz, 87.75 Hz and 92.25 Hz. FIG. 6b shows peak tracking of these four peaks 611, 621, 631, and 641 over time to display a magnitude of signal variation throughout time. The time tracking plot in FIG. 6b provides an indication of the strongest magnetic field strengths associated with a storm, typically correlating to when the storm is the strongest.

Figure 7:
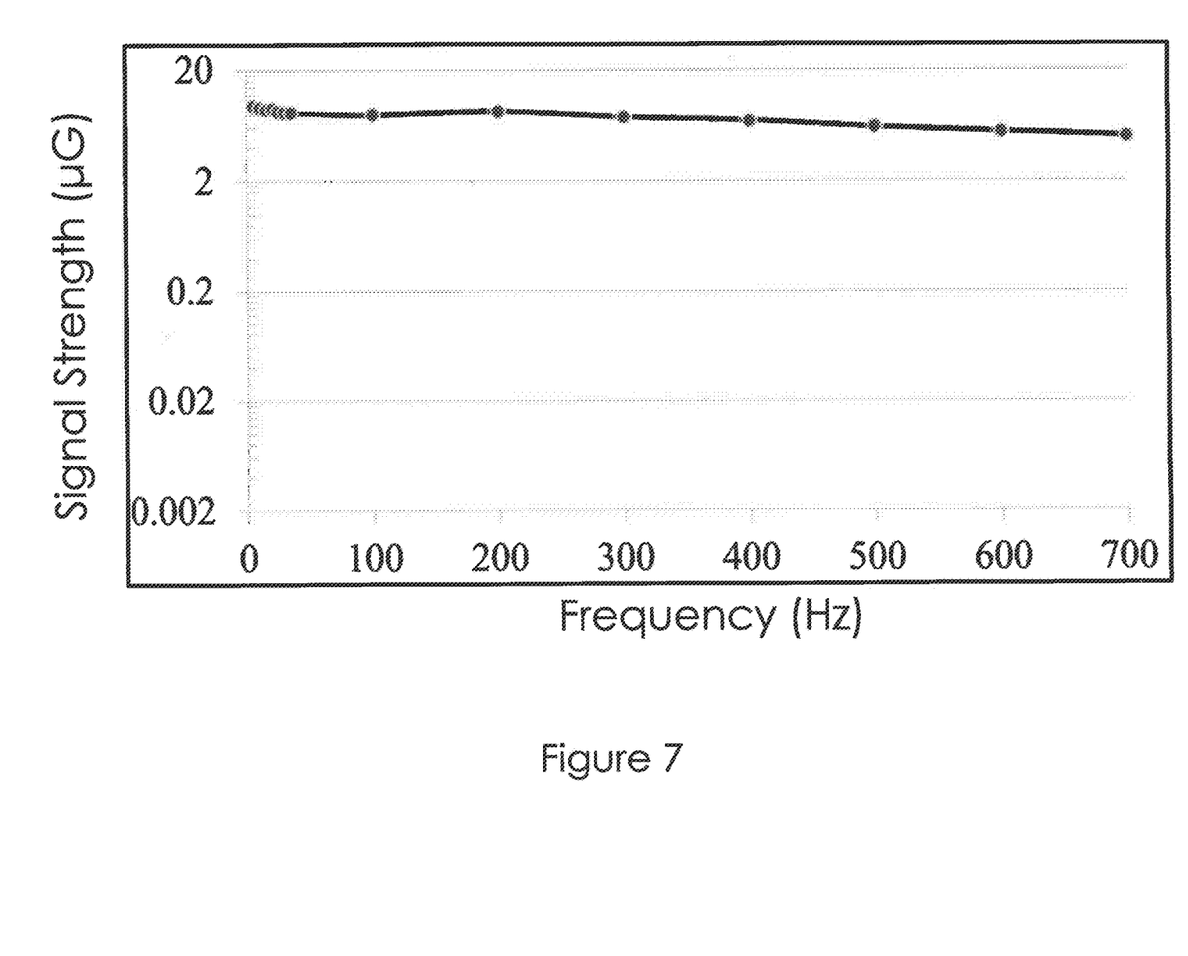
FIG. 7 is a schematic graphical representation of electromagnetic field strength sensitivity in accordance with an embodiment of a variable permeability magnetometer.

For initially determining a noise floor of the magnetometer, an initial measurement may be taken by applying a pseudorandom noise current signal to a Helmholtz coil and using a spectrum analyzer to observe sinusoidal signals, in the background noise, at least as small as 0.1 nano-Tesla, in the desired frequency range and to a calculate transfer function magnitude. The frequency response has been found to be uniform from DC (0 Hz) to 700 Hz as shown in the schematic graphical representation of FIG. 7. Further, linearity can be checked by applying a triangular wave current to the Helmholtz coil and verifying no signs of nonlinearity in the output response of the spectrum analyzer.

A magnetometer according to the present disclosure eliminates the need for a variable frequency oscillator and a frequency to voltage converter. Through the application of current from a high output impedance current source driven with a 10 kHz sinusoidal voltage across a right circular cylindrical search coil around a variable permeability core, a voltage measured across the coil is a direct measure of the strength of the ambient magnetic field. The magnetometer also has good linearity and excellent noise performance with sensitivity at least as fine the 0.1 nano-Tesla range. Further, a measured frequency response bandwidth had been found to extend from DC (0 Hz) to upwards of 700 Hz.

Due to its simplicity of construction, the magnetometer has a low cost of fabrication, is easily deployed in the field, and is inherently stable with variations in environmental conditions, such as temperature. The magnetometer can measure and/or monitor extremely low frequency electromagnetic signals and has a large frequency bandwidth. Thus it is suitable for numerous monitoring applications, including but not limited to:

(a) global lightning activity;
(b) possible earthquake predictions;
(c) severe local weather, such as storms, typhoons, hurricanes, tornadoes;
(d) global temperature variations and climate change on Earth;
(e) upper-tropospheric water-vapor variability;
(f) Ionosphere-related electromagnetic signals or Schumann resonances generated inside the waveguide cavity between planet Earth and Ionosphere;
(g) transient luminous events, such as sprites and elves;
(h) installation on small satellites, including those that have extremely limited power, weight and space;
(i) geomagnetic activities or Schumann Resonances on Venus, Mars, Titan, Jupiter or any other such planetary body;
(j) magnetic fields of Martian dust devils;
(k) changes in ground-based magnetic fields over time and their impact on weather and climate;
(l) detection and estimation of clandestine underground nuclear tests from hundreds of miles away; and
(m) integration of the magnetometer with an infrasonic sensor to provide verification of changes in rocks deep inside the earth prior to an earthquake.

Certain applications listed above are interrelated. For example, a surge in lightning may help in the prediction of tornadoes and severe weather formation. Similarly, detection of ground magnetic variations may precede earthquakes. In another aspect, the configuration of the magnetometer allows it can be deployed on small satellites and it is therefore suitable for monitoring magnetic fields in the upper atmosphere or on other planetary bodies.

For studying electromagnetic signals on Earth, a magnetometer having the coil assembly 100 of FIG. 1 may be enclosed in a wooden box 102 and buried at a depth (d) of six to nine inches below a ground surface 103, and data (arrows 104) may be transmitted wirelessly to a signal readout display 105 above the ground surface 103. Two or more such magnetometers may be installed at a minimum distance (D) of 2,000 miles apart in order to obtain coherence data of the two or more magnetometers. For verification and development of coherence algorithms, the magnetometers can be placed at a few miles apart. A network of magnetometers can provide information about change in magnetic fields and their impact on weather and climate on national or even global levels.

In keeping with the foregoing discussion, the term "magnetometer" is intended to encompass a coil assembly including a search coil around a variable permeability core and associated circuitry that measures an ambient magnetic field vis-à-vis the methods and examples of the present invention.

While preferred embodiments and example configurations of the invention have been herein illustrated, shown and described, it is to be appreciated that various changes, rearrangements and modifications may be made therein, without departing from the scope of the invention as defined by the claims. It is intended that specific embodiments and configurations disclosed are illustrative of the preferred and best modes for practicing the invention, and should not be interpreted as limitations on the scope of the invention as defined by the appended claims and it is to be appreciated that various changes, rearrangements and modifications may be made therein, without departing from the scope of the invention.

What is claimed is:

1. A magnetometer comprising:
a cylindrical coil assembly extending from a first end to an opposing second end, having a variable permeability core configured to measure low strength magnetic fields having a frequency response range between 0 and 700 hertz, the cylindrical coil assembly further comprising terminals, including at least a first terminal at the first end and a second terminal at the second end of the coil assembly, wherein the variable permeability core includes a plastic coil form and a foil strip constructed of a variable permeability magnetic material that is wrapped within the plastic coil form, the variable permeability core further including a search coil having a sense winding that is wound over the plastic coil form, the search coil further including a secondary winding configured for feedback control or calibration of the magnetometer, the secondary winding being disposed over the sense winding;
a current source circuit operably connected to the terminals, and including a crystal oscillator configured to provide a high-frequency clock signal to drive the current source circuit and thereby apply a plurality of electric currents to the cylindrical coil assembly, including a voltage-controlled sense current across the terminals, a feedback current applied to the secondary winding to cancel out variation in the Earth's field caused by a change in orientation of the cylindrical coil assembly, and a biasing current across the terminals; and
a voltage readout circuit operably connected to the terminals and configured to measure a voltage across the terminals, with direct current offsets eliminated, due to the applied voltage-controlled currents from the current source circuit,
wherein an inductance of the cylindrical coil assembly directly varies as an ambient magnetic field strength varies a permeability of the variable permeability core, and a voltage across the terminals varies directly with the inductance such that the measured voltage across the terminals is a direct measure of the ambient magnetic field strength.

2. The magnetometer of claim 1, wherein the foil strip is comprised of a cobalt-alloy magnetic material.

3. The magnetometer of claim 1, wherein the sense winding is comprised of an enameled copper wire having at least 500 turns.

4. The magnetometer of claim 1, wherein the voltage readout circuit includes a double synchronous demodulator, a low pass filter, and an integrator, and wherein the feedback current is fed to the secondary windings through each of the double synchronous demodulator, the low pass filter, and the integrator.

5. The magnetometer of claim 1, wherein the current source circuit further includes a digital frequency divider configured to divide the clock signal of the crystal oscillator from 1 MHz to a lower frequency of 10 kHz.

6. The magnetometer of claim 5, wherein the current source circuit further includes a signal shaper configured to shape the lower frequency signal of the digital frequency divider into a sinusoidal form.

7. The magnetometer of claim 1, wherein the current source circuit is configured to adjust the applied biasing current across the terminals to bias the variable permeability core to an optimum location of a core permeability curve.

8. A method of measuring a low magnetic field strength having a frequency response range of between 0 and 700 hertz comprising:
   applying a plurality of currents to a winding of a coil assembly having a variable permeability core, including a sinusoidal, voltage-controlled current across two opposing terminals of the coil assembly having the variable permeability core, the variable permeability core including a foil strip constructed of a variable permeability magnetic material wrapped within the plastic coil form, and a search coil wound over the plastic coil form;
   measuring a voltage applied across the terminals due to the sinusoidal, voltage-controlled current;
   calculating the low magnetic field strength from the measured voltage; and
   detecting a presence of a geophysical or atmospheric event using the calculated low magnetic field strength.

9. The method of claim 8 further comprising:
   applying a feedback signal to the winding of the coil assembly as one of the plurality of currents;
   enhancing a receiving cross section of the coil assembly; and
   measuring an adjusted voltage across the terminals.

10. The method of claim 9, further comprising removing, by the feedback signal, variations in ambient magnetic field strength due to a change in a coil assembly orientation.

11. The method of claim 8, wherein measuring the voltage includes applying a double synchronous detector for detecting a measured voltage that substantially eliminates 1/f noise, switch noise, and the direct current offsets.

12. The method of claim 11, wherein measuring the voltage further includes applying a low pass filter.

13. The method of claim 8, wherein applying the sinusoidal, voltage-controlled current source includes providing a clock signal, by a crystal oscillator, to drive a high-output impedance current source.

14. The method of claim 13, wherein applying the sinusoidal, voltage-controlled current source further includes:
   dividing the clock signal of the crystal oscillator to a lower frequency signal; and
   shaping the lower frequency signal into a sinusoidal form.

15. The method of claim 8, further comprising:
   enclosing each of a pair of the coil assemblies in a corresponding wooden box;
   burying the enclosed coil assemblies to a depth of six to nine inches below a ground surface a minimum distance of 2,000 miles apart; and
   wirelessly transmitting the measured voltage to a remote readout screen located above the ground surface.

16. The method of claim 8, wherein the foil strip of a variable permeability magnetic material is constructed of cobalt-alloy magnetic material.

17. The method of claim 8, wherein applying the plurality of currents includes applying each of:
   a 10 kHz sine oscillator signal as the sinusoidal, voltage-controlled current;
   a variable biasing current operable for biasing the core to a predetermined location of a core permeability curve; and
   a feedback current applied directly to the search coil.

* * * * *